US010629814B2

(12) United States Patent
Serrano-Garcia et al.

(10) Patent No.: US 10,629,814 B2
(45) Date of Patent: Apr. 21, 2020

(54) COAXIAL SEMICONDUCTIVE ORGANIC NANOFIBERS AND ELECTROSPINNING FABRICATION THEREOF

(71) Applicants: William Serrano-Garcia, Tampa, FL (US); Sylvia Thomas, Orlando, FL (US)

(72) Inventors: William Serrano-Garcia, Tampa, FL (US); Sylvia Thomas, Orlando, FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 15/891,178

(22) Filed: Feb. 7, 2018

(65) Prior Publication Data

US 2018/0226582 A1    Aug. 9, 2018

Related U.S. Application Data

(60) Provisional application No. 62/564,658, filed on Sep. 28, 2017, provisional application No. 62/456,049, filed on Feb. 7, 2017.

(51) Int. Cl.
*H01L 51/00* (2006.01)
*D01D 5/00* (2006.01)
(Continued)

(52) U.S. Cl.
CPC .......... *H01L 51/0035* (2013.01); *C08G 73/20* (2013.01); *C08L 65/00* (2013.01); *D01D 5/0038* (2013.01); *D01D 5/0046* (2013.01); *D01D 5/0069* (2013.01); *D01D 5/0092* (2013.01); *D01D 5/34* (2013.01); *D01F 6/04* (2013.01); *D01F 8/06* (2013.01); *D01F 8/12* (2013.01);
(Continued)

(58) Field of Classification Search
CPC . H01L 51/0035; H01L 51/0036; H01L 51/12; H01L 51/0562; C08L 65/00; C08L 2203/12; C08L 2203/20; D01D 5/0046; D01D 5/0069; D01D 5/0092; D01D 5/34; D01F 8/06; D01F 8/12; D01F 8/16; D10B 2321/02; D10B 2331/14; D10B 2331/30; D10B 2401/16
See application file for complete search history.

(56) References Cited

U.S. PATENT DOCUMENTS

2005/0279274 A1* 12/2005 Niu .................. B82Y 30/00
117/2
2009/0266411 A1* 10/2009 Habib .................. H01L 27/301
136/255
(Continued)

OTHER PUBLICATIONS

Alam et al., "Efficient Solar Cells from Layered Nanostructures of Donor and Acceptor Conjugated Polymers," Chem. Mater., 2004, 16(23):4647-4656.
(Continued)

*Primary Examiner* — Fernando L Toledo
*Assistant Examiner* — Neil R Prasad
(74) *Attorney, Agent, or Firm* — Thomas | Horstemeyer, LLP

(57) ABSTRACT

A coaxial nanocomposite including a core, which includes fibers of a first organic polymer, and a shell, which includes fibers of a second organic polymer, the first polymer and the second polymer forming a heterojunction.

20 Claims, 9 Drawing Sheets

(51) Int. Cl.

| | |
|---|---|
| D01D 5/34 | (2006.01) |
| D01F 8/16 | (2006.01) |
| D01F 8/06 | (2006.01) |
| D01F 8/12 | (2006.01) |
| C08L 65/00 | (2006.01) |
| D01F 6/04 | (2006.01) |
| C08G 73/20 | (2006.01) |
| H01L 51/05 | (2006.01) |
| C08G 61/12 | (2006.01) |
| C08L 79/04 | (2006.01) |

(52) U.S. Cl.
CPC ............ *D01F 8/16* (2013.01); *H01L 51/0036* (2013.01); *C08G 61/126* (2013.01); *C08G 2261/1412* (2013.01); *C08G 2261/212* (2013.01); *C08G 2261/3223* (2013.01); *C08G 2261/51* (2013.01); *C08G 2261/91* (2013.01); *C08G 2261/92* (2013.01); *C08G 2261/94* (2013.01); *C08L 79/04* (2013.01); *C08L 2203/12* (2013.01); *C08L 2203/20* (2013.01); *D10B 2321/02* (2013.01); *D10B 2331/14* (2013.01); *D10B 2331/30* (2013.01); *D10B 2401/16* (2013.01); *H01L 51/0562* (2013.01); *Y02E 10/549* (2013.01)

(56) References Cited

U.S. PATENT DOCUMENTS

| | | | | |
|---|---|---|---|---|
| 2012/0189795 | A1* | 7/2012 | Wong | D01D 5/0069 428/36.91 |
| 2013/0149523 | A1* | 6/2013 | Tsotsis | D01D 5/24 428/297.4 |
| 2014/0315020 | A1* | 10/2014 | Sun | H01B 13/148 428/379 |
| 2015/0118626 | A1* | 4/2015 | Yoon | D01D 5/0069 430/322 |

OTHER PUBLICATIONS

Anthony, "Organic electronics: Addressing challenges," Nature Materials, 2014, 13(8):773-775.
Babel et al., "Ambipolar Charge Transport in Air-Stable Polymer Blend Thin-Film Transistors," Adv. Funct. Mater., 2004, 14, 891-898.
Babel et al., "High Electron Mobility in Ladder Polymer Field-Effect Transistors," JACS, 2003, 125(45):13656-13657.
Barakat et al., "Titanium-based polymeric electrospun nanofiber mats as a novel organic semiconductor," Materials Science and Engineering B, 2012, 177:34-42.
Briseno et al., "n-Channel polymer thin film transistors with long-term air-stability and durability and their use in complementary inverters ," J. Mater. Chem. 2011, 21:16461-16466.
Briseno et al., "Self-Assembly, Molecular Packing, and Electron Transport in n-Type Polymer Semiconductor Nanobelts," Chem. Mater., 2008, 20(14):4712-4719.
Chang et al., "Flexible Nonvolatile Transistor Memory Devices Based on One-Dimensional Electrospun P3HT:Au Hybrid Nanofibers," Chen, Adv. Funct. Mater., 2013, 23(39):4960-4968.
Chang et al., "Nhanced Mobility of Poly(3-hexylthiophene) Transistors by Spin-Coating from High-Boiling-Point Solvents," Chem. Mater., 2004, 16(23):4772-4776.
Dalal et al., "Tunable molecular orientation and elevated thermal stability of vapor-deposited organic semiconductors," PNAS, 2015, 112(14):4227-4232.
Fukuda et al., "Fully Solution-Processed Flexible Organic Thin Film Transistor Arrays with High Mobility and Exceptional Uniformity," Scientific Reports, 2014, 4:3947.
Gao et al., "Flexible Tactile Sensor Using the Reversible Deformation of Poly(3-hexylthiophene) Nanofiber Assemblies," Langmuir, 2012, 28(51):17593-17596.
Gonzales et al., "Electrospun poly(3-hexylthiophene-2,5-diyl) fiber field effect transistor," Synth Met, 2005, 151(3):275-278.
Guarino et al., "Additive electrospraying: a route to process electrospun scaffolds for controlled molecular release," Polym. Adv. Technol., 2015, 26(12):1359-1369.
Hur et al., "P3HT-PS blend nanofiber FET based on electrospinning," 10th IEEE Int. Conf. Nanotech. 2010, Seoul, North Korea, pp. 533-536.
Irimia-Vladu, ""Green" electronics: biodegradable and biocompatible materials and devices for sustainable future," Chem. Soc. Rev., 2014, 43(2):588-610.
Jenekhe et al., "Photoinduced Electron Transfer in Binary Blends of Conjugated Polymers," Chem. Mater., 1996, 8(10):2401-2404.
Jin et al., "Electrospun photosensitive nanofibers: potential for photocurrent therapy in skin regeneration," Photochem. Photobiol. Sci., 2013, 12:124-134.
Khajavi et al., "Electrospinning as a versatile method for fabricating coreshell, hollow and porous nanofibers," Scientia Iranica F, 2012, 19(6):2029-2034.
Kleinschmidt et al., "Poly(3-hexylthiophene) (P3HT): fruit fly or outlier in organic solar cell research?," J. Mater. Chem. A, 2017, 5:11396-11400.
Lee et al., "Continuous production of uniform poly(3-hexylthiophene) (P3HT) nanofibers by electrospinning and their electrical properties," J. Mater. Chem., 2009, 19(6):743-748.
Lee et al., "Periodic Array of Polyelectrolyte-Gated Organic Transistors from Electrospun Poly(3-hexylthiophene) Nanofibers," Nano. Lett., 2010, 10(1):347-351.
Li et al., "Recent advances in one-dimensional organic p-n heterojunctions for optoelectronic device applications ," J. Mater. Chem. C, 2016, 4:9388-9398.
Lotus et al., "Electrospinning Route for the Fabrication of P—N Junction Using Nanofiber Yams," College of Polymer Science and Polymer Engineering, 2009, Paper 83.
Luzio et al., "Electrospun Polymer Fibers for Electronic Applications," Materials, 2014, 7:906-947.
Ma et al., "Thermally Stable, Efficient Polymer Solar Cells with Nanoscale Control of the Interpenetrating Network Morphology," Adv. Funct. Mater., 2005, 15(10):1617-1622.
Moghe et al., "Co-axial Electrospinning for Nanofiber Structures: Preparation and Applications," Polymer Reviews, 2008, 48, 353-377.
Narayan et al., "Photoconducting properties of a ladder polymer," J. Appl. Phys., 1995, 77, 3938-3941.
Pinto et al., "Rectifying junctions of tin oxide and poly(3-hexylthiophene) nanofibers fabricated via electrospinning," Appl. Phys. Lett. 2009, 94, 083504, 3 pages.
Qiu et al., "Organic Thin-Film Transistors Based on Blends of Poly(3-hexylthiophene) and Polystyrene with a Solubility-Induced Low Percolation Threshold," Chem. Mater., 2009, 21(19):4380-4386.
Reese et al., "Pathways for the degradation of organic photovoltaic P3HT: PCBM based devices," Solar Energy Mater & Solar Cells, 2008, 92(7):746-752.
Saranin et al., "Organic P3HT diode with EDLC induced p-n junction," Energy Efficiency Center, NUST MISiS, Moscow, Russia, 2016.
Serrano et al., "Electrospun composite poly(lactic acid)/polyaniline nanofibers from low concentrations in CHCl3: Making a biocompatible polyester electro-active," Polymer, 2014, 55(22):5727-5733.
Serrano et al., "Poly(lactic acid)/poly(3-hexylthiophene) composite nanofiber fabrication for electronic applications," Polym Int, 2016, 65(5):503-507.
Serrano-Garcia et al., "Electrospun Composite Nanofibers of Semiconductive Polymers for Coaxial p-n Junctions," USF College of Engineering, Research Day, 2015.
Serrano-Garcia et al., "Electrospun Fibers of Poly(Vinylidene Fluoride-Trifluoroethylene)/Poly(3-Hexylthiophene) Blends from Tetrahydrofuran," Ferroelectrics, 2012, 432(1):41-48.

(56) References Cited

OTHER PUBLICATIONS

Sun et al., "Liquid Crystalline Polymers for Efficient Bilayer-Bulk-Heterojunction Solar Cells," Phys Chem C, 2009, 113(18):7892-7897.
Sundarrajan et al., "Fabrication of P3HT/PCBM solar cloth by electrospinning technique," Mater. Lett., 2010, 64, 2369-2372.
Yoo et al., "Surface-functionalized electrospun nanofibers for tissue engineering and drug delivery," Advanced Drug Delivery Reviews, 2009, 61(12):1033-1042.

\* cited by examiner

COAXIAL SEMICONDUCTIVE ORGANIC NANOFIBERS AND ELECTROSPINNING FABRICATION THEREOF

CROSS-REFERENCE TO RELATED APPLICATION(S)

This application claims the benefit of U.S. Provisional Patent Application No. 62/456,049, filed on Feb. 7, 2017, and U.S. Provisional Patent Application No. 62/564,658, filed on Sep. 28, 2017, the contents of both applications being incorporated herein by reference.

STATEMENT REGARDING FEDERALLY SPONSORED RESEARCH

This invention was made with government support under grant number 1400837 awarded by the National Science Foundation. The government has certain rights in the invention.

TECHNICAL FIELD

The present invention pertains to nanostructures useful for organic semiconductive devices. More specifically, the present invention pertains to organic coaxial p-n junctions prepared by electrospinning.

BACKGROUND OF THE INVENTION

The electrospinning technique is a reliable and low-cost method that has been broadly used in the fabrication of nanofibers for intelligent textiles, filters, and bone scaffolds. Electrospinning has also been used to fabricate microtubes, drug delivery nanochannels, and devices for multifunctional applications.

SUMMARY OF THE INVENTION

Intelligent textiles, air/water filters, bone scaffolds, and drug delivery applications have all directly benefitted from the reliable and low-cost electrospinning technique for fiber fabrication. This technique has also been used to fabricate fibrous electronic devices. Diodes, field effect transistors, and sensors that use organic semiconductive polymers offer unique characteristics that can be found only in such polymers (e.g., excellent thermal stability, tunable electrical conductivity, mechanical flexibility, and chemical/biological functionality).

In the present disclosure, electrospinning is used to fabricate, for the first time, a polymer-polymer coaxial-structure nanofiber. This is demonstrated with the p-type regioregular polymer poly(3-hexylthiophene-2,5-diyl) (P3HT) and the n-type conjugated ladder polymer poly(benzimidazobenzophenanthroline) (BBL). P3HT was successfully used as the core and the BBL as the shell, thus forming a p-n junction that is cylindrical in form. This disclosure significantly advances the state-of-the-art of organic electroactive polymer structures for efficient coaxial flexible arrays. These arrays can have increased electrical efficiency and lower power requirements, thus advancing the state-of-the-art for fiber-based devices.

In one embodiment, the invention provides a coaxial nanocomposite including a core, which includes fibers of a first organic polymer, and a shell, which includes fibers of a second organic polymer, the first polymer and the second polymer forming a heterojunction.

In another embodiment, the invention provides a method of producing a coaxial nanocomposite including a core, which includes fibers of a first organic polymer, and a shell, which includes fibers of a second organic polymer, the first polymer and the second polymer forming a heterojunction; where the method includes dissolving the first polymer in a first solvent to form a first mixture, dissolving the second polymer in a second solvent to form a second mixture, and electrospinning the first mixture and the second mixture.

In yet another embodiment, the invention provides an article including a coaxial nanocomposite including a core, which includes fibers of a first organic polymer, and a shell, which includes fibers of a second organic polymer, the first polymer and the second polymer forming a heterojunction.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

One aspect of the invention provides a new structure for organic semiconductive electronics, which may be prepared with the electrospinning technique.

Another aspect of the invention provides for the fabrication of coaxial arranged devices and nanostructures fabricated with the electrospinning technique from organic semiconductive and conductive polymers. For example, nanostructures with diameters ranging from about 100 nm to about 3000 nm can be formed.

Also provided in this disclosure is a single-step electrospinning method for forming a p-n junction of organic semiconductive and/or conductive polymers, useful for electrical devices, for example. This is a significant advance in the current state-of-the-art of organic semiconductors. More specifically, applications of the disclosed invention include bio devices and flexible devices, such as biosensors, flexible displays, flexible sensors, and bioarrays.

Figure 1:
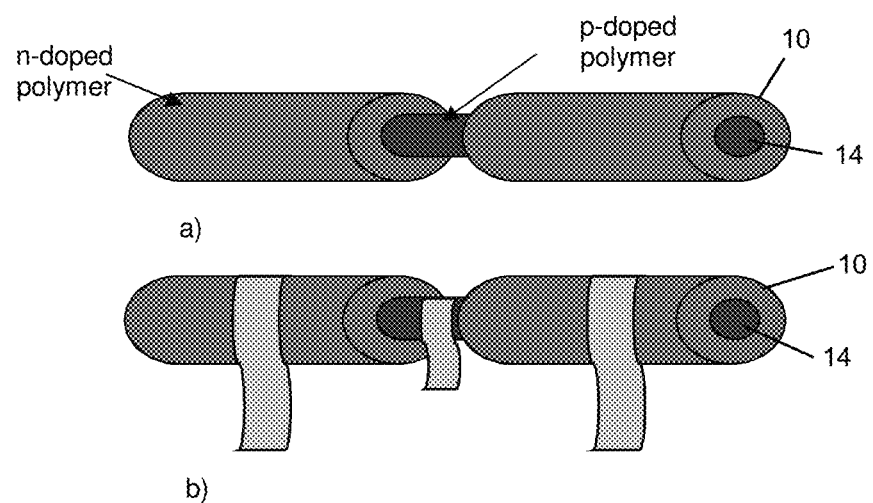
FIG. 1 illustrates (a) a core/shell structure and (b) electrode locations for different electrical characterizations and applications (i.e., diode, sensor, field effect transistor).

Among other things, the disclosed invention has the novelty of fabricating a core/shell nanofiber (FIG. 1) using organic semiconductive and/or conductive polymers, which are used for the fabrication of organic diodes, transistors, and sensors, for example. The internal (core) nanofiber 10 is one forming a direct junction with the shell 14, generating a p-n junction (a diode).

Figure 2:
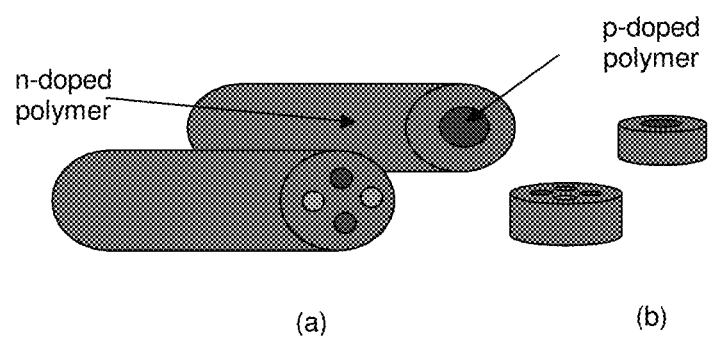
FIG. 2 illustrates coaxial nanofibers showing (a) single and multiple core arrays and (b) their respective nanodisks.

The internal core also can be inclusive of two or more organic semiconducting fibers having the composition of blended or distinct polymers. If the internal separation of core nanofibers is larger than 0, a multicore coaxial fiber is created. The core strands can be from the same or different organic semiconductive or conductive polymers. Also, novel single core and multi-core nanodisks are derived by slicing the fibers (FIG. 2). Moreover, each part of the core can be used as a sensor to sense different variables at the same time, i.e., synchronized parallel sensing.

In certain embodiments, the method of fabrication is based on the electrospinning technique. It is disclosed herein how to produce a core/shell structure having different doping to create a p-n heterojunction diode. For example, the shell can be an insulator with a semiconductive core to form a field-effect transistor (FET), or the shell can be doped to create a semiconductor nanotube.

In certain other embodiments, a multicore nanofiber can be produced. Multicore nanofibers possess different strands of materials inside the core to allow for the sensing of different elements, e.g., multi-gas nanosensors. This multicore array may also be useful for improving organic solar cells, for example.

Coaxial nanofiber structures of organic semiconductive and conductive polymers can be formed using the electrospinning technique, as disclosed herein. Physical contact between the fibers illustrates the formation of a basic electronic device, an organic junction diode. This structure having a semiconductive polymer as a core and another polymer as the shell (i.e., p-type and n-type, respectively) can be formed continuously, for example by adding a coaxial syringe as the extruder. This structure is useful for advancing organic diodes, field effect transistors, sensors, and organic solar cell structures needing to capitalize on high surface area, for example.

In certain embodiments, the disclosed invention is intended to use organic semiconductor polymers for electronic device fabrication that includes everything from basic electronic devices (i.e., as diodes) to sensors. These organic polymers have excellent thermal stability, electrical conductivity, mechanical flexibility, and chemical/biological functionality. An exemplary embodiment of such a semiconductive polymer is regioregular p-doped poly(3-hexylthiophene-2,5-diyl) (P3HT) and ladder n-doped poly (benzimidazobenzophenanthroline) (BBL). In this embodiment, the core comprises P3HT and the shell comprises BBL to form nanofibers having a cylindrical p-n junction.

The disclosed invention is a significant advance in the art of organic polymeric semiconductors, such as for efficient flexible arrays with better performance and lower power requirements, as well as advancing and increasing the application and implementation of the electrospinning technique in general. The disclosed process establishes a reliable electrospinning procedure and setup for the predictable formation of coaxial organic semiconductors.

Organic semiconductive polymers have excellent thermal stability, electrical conductivity, mechanical flexibility, and chemical/biological functionality. Polymeric coaxial arrangements may be useful in drug delivery and hollow fiber channels. Although some previous work has been reported on organic semiconducting p-n junction nanofibers in a coaxial core-shell (core-sheath) structure, these focused exclusively on small-molecule (organic-organic) heterojunctions and partial organic (organic/polymer-inorganic) heterojunctions rather than polymeric heterojunctions. Polymer-polymer heterojunctions have not been fabricated until now.

Organic semiconductive coaxial nanofibers can produce p-n junctions with enhanced electronic properties and fabrication reliability, thus making them excellent candidates for use in flexible electronics, crosslinking, and cost-effective nanomanufacturing. More specifically, these novel organic semiconductive p-n junctions can demonstrate high $I_{on}/I_{off}$ ratios and, in field-effect transistor (FET) mode, a reduction in leakage current compared to thin film structures. In diode mode, a tunable depletion region can be achieved by the phase created by the outer covering. Therefore, due to the large surface area that can be generated by nanofibers (as a non-woven mesh, woven mesh, or crossed or aligned nanofibers, for example) in a small region, a coaxial p-n junction matrix can be capable of performing as a sensor. As a result, the surface of the nanofibers can be functionalized for specific sensing and higher selectivity, improving the performance for electronic applications.

Nanofibers of the semiconductive regioregular polymer poly(3-hexylthiophene-2,5-diyl) (P3HT, with field effect mobilities as high as 0.1 $cm^2V^{-1}s^{-1}$) and thin films, as well as self-assembled nanobelts, of the ladder polymer poly (benzimidazobenzophenanthroline) (BBL, with electron mobilities of approximately $1 \times 10^{-3}$ $cm^2V^{-1}s^{-1}$ and $7 \times 10^{-3}$ $cm^2V^{-1}s^{-1}$, respectively) have been characterized as having morphologies and high-mobility behaviors that make them ideal candidates for organic electronics. However, fiber fabrication of pure P3HT is challenging (due its low molecular weight), and under laboratory conditions, this material tends to degrade over time due to oxygen exposure. BBL, on the other hand, has been shown to exhibit high stability in air over a long period of time, thus improving the shelf life of the formed devices. Polystyrene (PS), as well as other suitable polymers (e.g., polylactic acid (PLA), polyethylene oxide (PEO), polyvinylidene fluoride (PVDF)), can be used to facilitate the formation of P3HT fibers.

Disclosed herein, among other things, is an investigation of the utility of organic semiconductive polymers—specifically, P3HT and BBL—in forming one-dimensional (1D) coaxial p-n junctions for, e.g., the miniaturization of organic electronics. Devices with greater efficiency and lower power requirements can thus be developed for textile applications. More broadly, this disclosure addresses the technological challenges of using nanoelectronics and nanosensors for flexible, low-power nanodevices (e.g., tethered and 1D components for chemical, vapor, and gas sensing) by enhancing the nanometric morphology of the coaxial structure.

Figure 3:
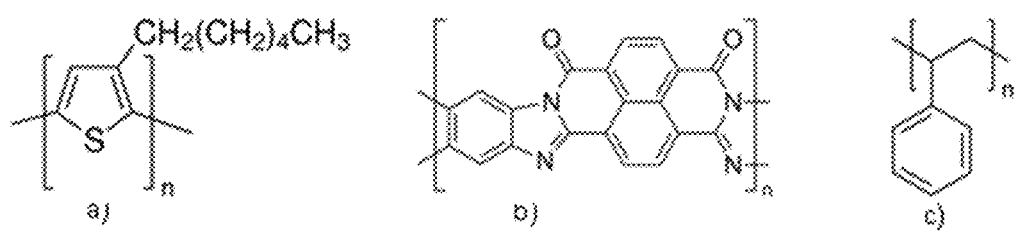
FIG. 3 illustrates the chemical structure of semiconducting polymers (a) P3HT and (b) BBL. In certain embodiments, (c) PS, PLA, PEO, or PVDF can be added to the P3HT to improve mechanical support for fiber formation.

Also disclosed herein is the production of a nanofiber with a P3HT/PS core and a protective, electrically active outer shell or sheath of BBL (FIG. 3). This approach is novel at least because of its polymer-polymer structure and its electrospinning-based fabrication process. The present disclosure thereby advances fundamental and practical knowledge regarding the use of organic semiconducting nanodevices for flexible electronics and multi-dimensional integrated circuits.

Figure 4:
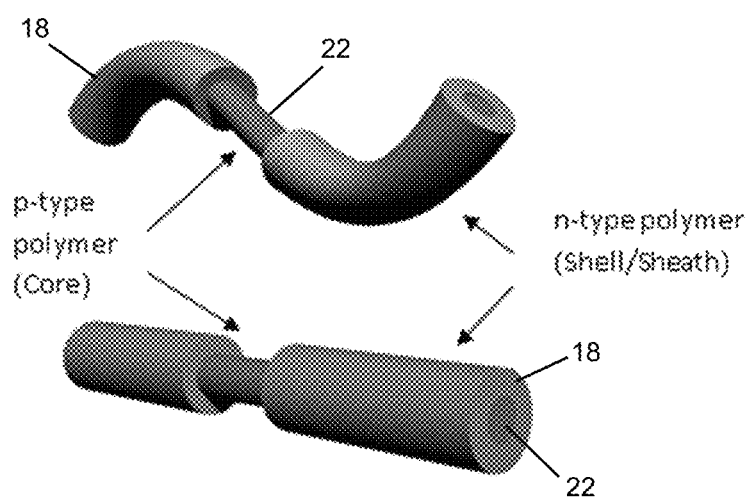
FIG. 4 illustrates coaxial nanofibers with p- and n-type semiconducting polymers. Nanofibers provide an opportunity to form p-n junctions that can be tethered for electroactive textiles and single-nanofiber devices, for example.

In this disclosure, coaxial semiconductive polymer-polymer nanofibers were, for the first time, fabricated and morphologically characterized. The homogeneous composite P3HT/PS served as the core 18 and the BBL solution formed the shell 22, thereby achieving the desired structure (FIG. 4). The p-n junctions thus formed can perform as, among other things, diodes, sensors, and transistors, as well as photodiodes, which includes solar cell applications.

At low concentrations of P3HT, it is difficult for the electrospinning technique to generate well-formed fibers. Without being limited by theory, this difficulty is due to a solution viscosity being insufficient to form molecular entanglements, which in turn results in a solution extensional viscosity too low to form fibers. To overcome this impediment, PS was added to the P3HT solution to provide mechanical support for fiber formation without risking the semiconductive property of P3HT.

At 7 wt % PS, the solution was sufficiently viscous and electrically charged by the P3HT such that core fibers with a diameter of 200 nm were formed. The BBL solution required no additional polymer for fiber production; the PS in the core-material solution indirectly helped to form and support the final structure. This method can also make the PS fiber composite electroactive as the semiconductor carrier. As noted above, the PS and P3HT polymers were dissolved in $CHCl_3$. Because BBL does not dissolve in $CHCl_3$, extrusion into the electric field resulted in the BBL coating the P3HT/PS core nanofibers—moving from a viscous to a flexible state, to solvent evaporation and stretching to form the coaxial nanofiber (FIG. 4).

Figure 6:
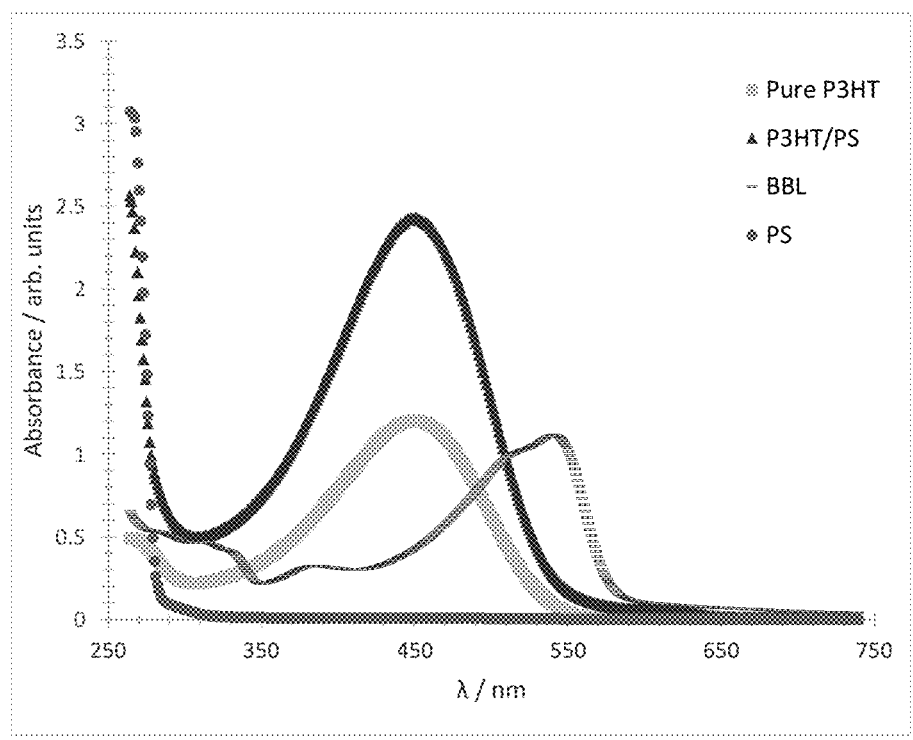
FIG. 6 illustrates a comparison of the UV/vis spectra of pure PS (7 wt %), pure P3HT (2 wt % in $CHCl_3$), and a P3HT/PS (0.4 wt %/7 wt %) blend. The spectra indicate that adding PS does not significantly change the physical or optical characteristics of P3HT. The BBL solution (0.39 wt %) exhibits a characteristically broad absorption peak at about 540 nm.

The UV/vis spectrum of the P3HT/PS polymer composite was compared to the spectra of the pure (in $CHCl_3$) PS and P3HT solution (FIG. 6). Over the wavelength range examined, the spectrum of the colorless PS solution is essentially featureless. The P3HT solution exhibits an absorption peak at approximately 450 nm, as does the P3HT/PS blend. This peak is attributable to the $\pi$-$\pi$* transition of the electronic absorption spectra, as documented for pure P3HT. The coincidence of these peak positions indicates that the PS and P3HT polymers are homogeneously integrated within the blend solution, without phase separation or chemical interaction. Measuring the UV/vis spectra in this way also enabled the BBL to show the absorption peak that defines its optical band gap. The BBL spectrum showed a peak at about 380 nm and a wider peak at about 540 nm due to the onset of $\pi$-$\pi$* transition; this spectrum is characteristic of this ladder polymer. These $\pi$-$\pi$* transitions determine the band gaps of P3HT and BBL, which are generally about 2.2 eV and 1.9 eV, respectively, in agreement with the optical band gap cutoff values determined from the UV-vis spectra shown in FIG. 6.

Figure 7:
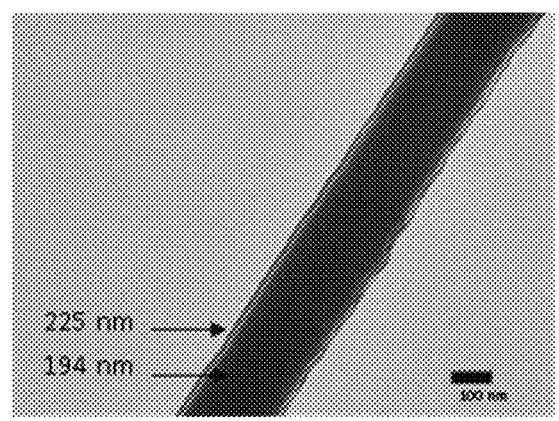
FIG. 7 illustrates a TEM image of a coaxial nanofiber with a P3HT/PS (0.4 wt %/7 wt %) core and a BBL (0.39 wt %) shell. The scale bar represents 100 nm.

While the P3HT/PS blend solution showed no evidence of separation or precipitation, the combined solutions of P3HT/PS and BBL were heterogeneous. The reason may be that BBL is insoluble in $CHCl_3$ and P3HT is insoluble in MSA. These characteristics led to the successful formation of nanometric coaxial fibers. TEM images of the fibers show well-formed core and shell structures (FIG. 7). The smallest nanofiber examined had a total diameter of about 225 nm, with a core diameter of about 193.9 nm and a stable BBL shell thickness of about 31.4 nm.

Figure 8:
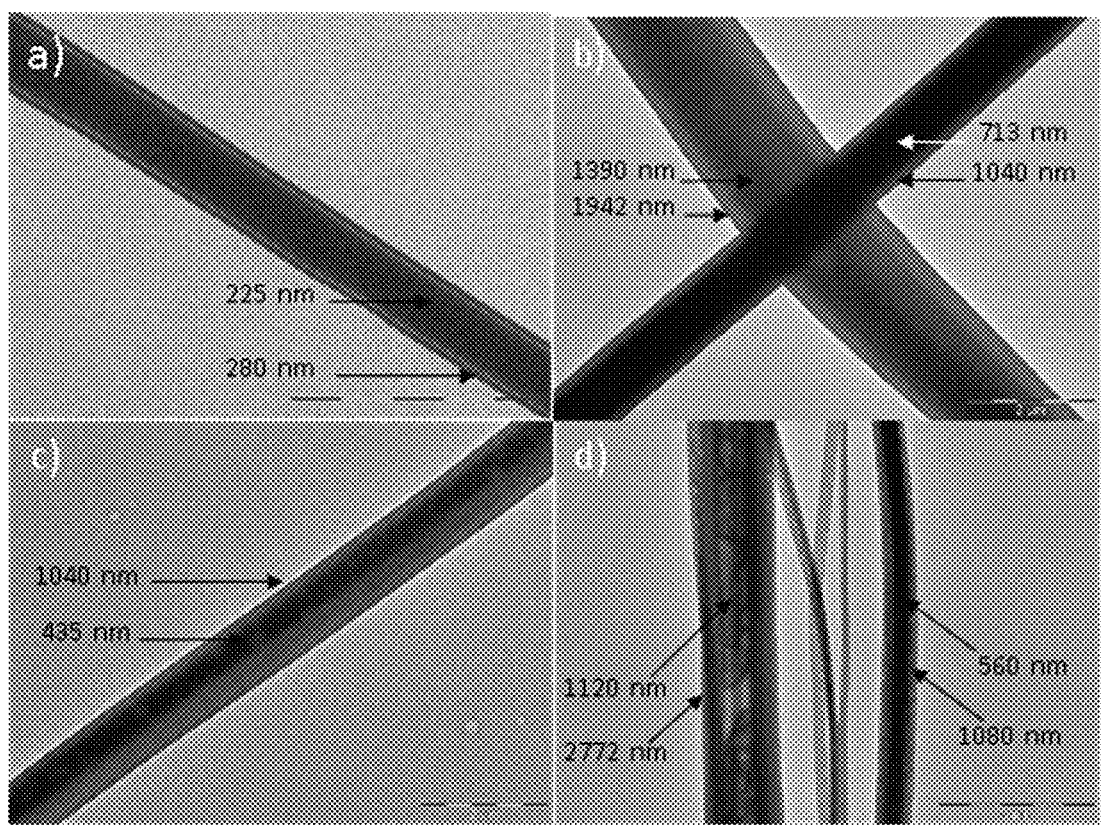
FIG. 8 illustrates TEM images of coaxial nanofibers (P3HT/PS core with BBL shell) created simultaneously within a single run of the electrospinning technique. The scale bars represent (a) 1 μm, (b, c) 2 μm, (d) and 5 μm.

With the electrospinning technique, a variety of fiber sizes can be generated within a single production run. Alternately, the diameters of the coaxial nanofiber can be controlled (e.g., by concentration of the solutions, molecular weights, electric field, and/or pump rate). FIG. 8 shows electrospun fibers from a single run, with diameters ranging from about 280 to about 2800 nanometers. The variety of sizes in this case is due to weak agglomeration at the syringe tip, which slightly changes the material extrusion into the electric field. In contrast, a subsequent production run can yield coaxial nanofibers with a similar range of diameters. In certain embodiments, it may be desirable to fabricate nanofibers of a single, specific diameter.

In certain embodiments, the coaxial nanocomposite diameter may be from about 200 nm to about 3000 nm, such as about 225 nm, about 280 nm, about 1040 nm, about 1080 nm, about 1942 nm, or about 2772 nm. In certain embodiments, the core diameter may be from about 150 nm to about 250 nm, such as about 194 nm, about 200 nm, or about 225 nm. In other embodiments, the core diameter may be greater than 200 nm, such as about 435 nm, about 713 nm, about 1390 nm, or about 2772 nm. In certain embodiments, the shell diameter may be from about 25 nm to about 75 nm, such as about 30 nm, about 31 nm, or about 55 nm. In other embodiments, the shell diameter may be greater than 75 nm, such as about 327 nm, about 520 nm, about 552 nm, about 605 nm, or about 1652 nm.

In certain embodiments, the solution concentration of PS prior to electrospinning may be from about 5 wt % to about 10 wt %, such as about 7 wt %. A concentration of PS less than about 7 wt % or less than about 5 wt % may be suitable for producing fibers with a beaded structure (i.e., pendants, beaded). A concentration of PS greater than 7 wt % or greater than 10 wt % may be suitable for producing agglomerated fibers or films. In certain embodiments, the solution concentration of P3HT prior to electrospinning may be from about 0.1 wt % to about 2.0 wt %, such as 0.4 wt %. However, a concentration of about 2.0 wt % may significantly increase the electrical charge of the solution and other electrospinning parameters may need to be adjusted accordingly. In certain embodiments, the solution concentration of BBL prior to electrospinning may be from about 0.2 wt % to about 0.5 wt %, such as about 0.39 wt %. In certain embodiments, the amount of PS present in the nanocomposite may be from about 6 wt % to about 8 wt %, such as about 7 wt %. Alternately, the amount of PS may be less than 6 wt %, particularly when the molecular weight is greater.

In certain embodiments, the pump rate may be about 3000 µL/hr. Alternately, the pump rate may be less than 3000 µL/hr or greater than 3000 µL/hr. In certain embodiments, the electric field may be set at about 9 kV to about 15 kV, such as about 9 kV.

Figure 9:
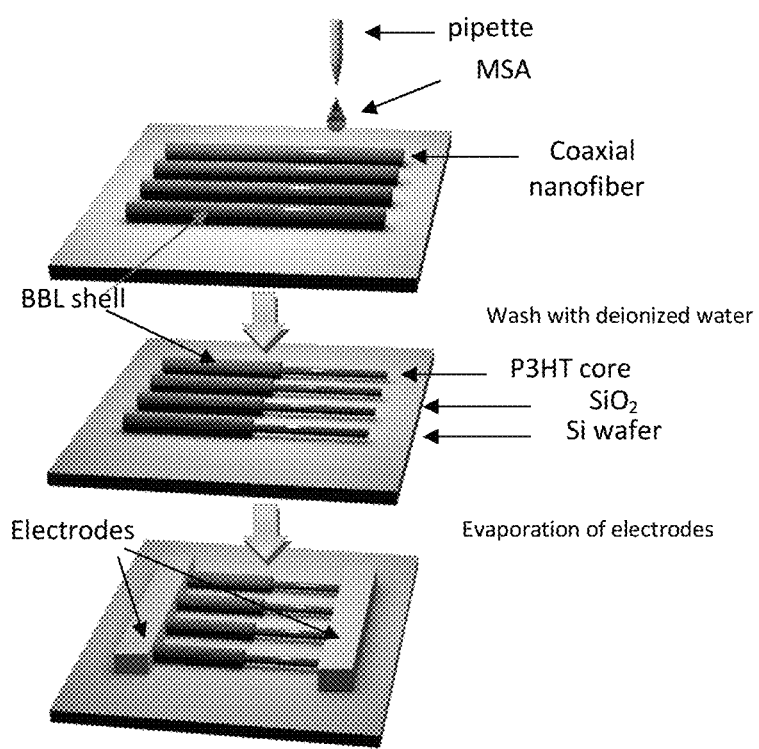
FIG. 9 illustrates electrical characterizations of coaxial nanofibers, made possible by using a small amount of MSA to remove the BBL shell and expose the P3HT core. Electrodes are evaporated at the shell and the core. The resulting devices can work as diodes, FETs, and sensors, as well as photoactive devices for organic solar-cell meshes, for example.

Although this disclosure focuses on optical and physical characterizations of the coaxial fibers, electrical characterizations (FIG. 9) are also contemplated herein. For example, MSA can be used to remove the outer BBL layer and expose the P3HT nanofiber core without damaging it. A small amount of acid can be drop casted with a microliter pipette onto the ends of nanofibers mounted on a silicon-silicon dioxide wafer. After rinsing the fibers with deionized water, gold electrodes can then be added, and electrical characterizations for diode, FET, and sensor capabilities (e.g., organic gases, UV radiation) can be performed. Additionally or alternately, other electrical characterizations such as atomic force microscopy (AFM) for electrostatic (EFM), Kelvin probe (KPFM), and photoconductivity can be performed.

To reiterate, disclosed herein for the first time is the electrospinning fabrication of pure-polymer, composite coaxial P3HT/PS-BBL fibers to form a p-n junction in a coaxial structure. The electrically active materials in this case are P3HT and BBL, with PS providing mechanical support for the thin fiber P3HT core. UV-VIS analysis shows that no chemical or physical changes occurred when the P3HT was blended with the PS. Strategic solvent selection ensured the formation of electrospun fibers that are simultaneously coated with a protective BBL shell. The composite fibers had diameters ranging from about 225 nm to about 2800 nm. This coaxial structure can support the development of flexible, multifunctional electronic devices, including tunable diodes for UV radiation detectors and rectifiers for integrated intelligent textiles. The ability to use electrospinning to make electroactive coaxial nanofibers from novel organic polymer-based structures has profound implications for the construction of a variety of electronic devices, including diodes, field effect transistors, and sensors.

EXAMPLES

It should be kept in mind that the following described embodiments are only presented by way of example and should not be construed as limiting the inventive concept to any particular physical configuration.

Electronic grade p-type regioregular poly(3-hexylthiophene-2,5-diyl) (P3HT) from Lumtec, n-type polymer poly(benzimidazobenzophenanthroline) (BBL) and polystyrene (PS), both from SigmaAldrich, (FIG. 3) were used as received. Solutions of anhydrous chloroform ($CHCl_3$) were used to dissolve the P3HT and PS (and to allow for subsequent optical characterization); methanesulfonic acid (MSA), from SigmaAldrich, was used to dissolve the BBL. Solutions were prepared based on weight percent (wt %). For the core-material solution of P3HT/PS, 7 wt % PS/$CHCl_3$ was used to lend mechanical support to the P3HT molecules; the final concentration of P3HT in the P3HT/PS/$CHCl_3$ blend was 0.4 wt %. For the shell-material solution, 0.39 wt % BBL was dissolved in MSA. Each of the two solutions was thoroughly blended with a magnetic stirrer until homogeneous equilibria were achieved.

PS dissolved in chloroform is colorless; adding P3HT, which is red, imparts a red color to the solution blend. Dissolving BBL in MSA yields a dark red solution; in contact with $CHCl_3$, though, BBL changes to a vivid blue-violet color. UV/vis spectra were obtained (using an Evolution 201 PC spectrometer) for the solutions of pure PS, pure P3HT, blended P3HT/PS, and pure BBL.

Figure 5:
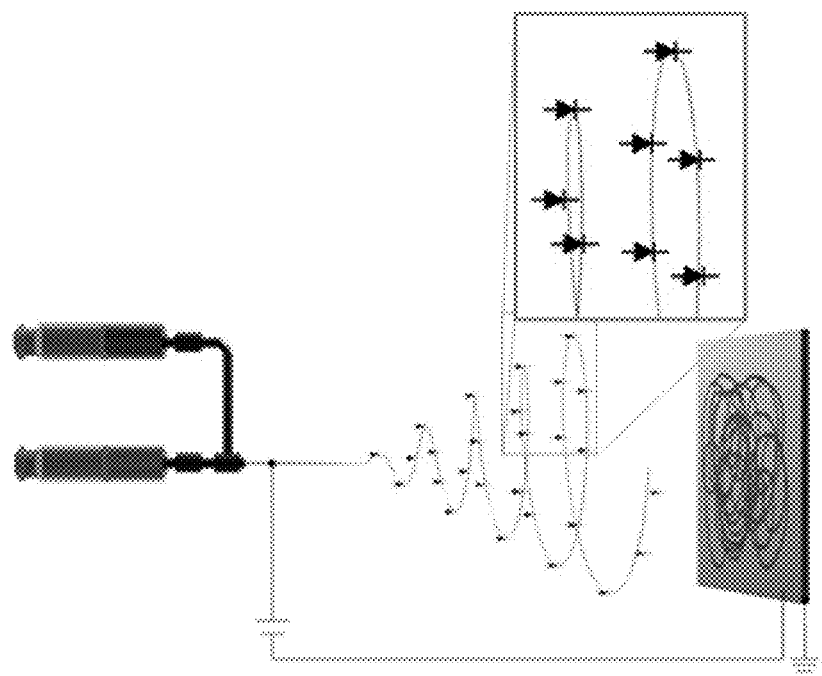
FIG. 5 illustrates the continuous fabrication of coaxial nanofiber p-n junctions using the electrospinning technique. In an exemplary embodiment, BBL solution forms the shell/sheath and P3HT/PS solution forms the core. An electric field overcomes the surface tension, stretching the solution and forming nanofibers. The inset illustrates a magnified view of Taylor cone formation, the diode symbols representing the continuous heterojunction formed between the core and the shell.

To form the coaxial nanofibers (FIG. 4) from these solutions, the electrospinning technique was employed (FIG. 5), using two luer-lock syringes and a coaxial needle (Ramé-Hart Instrument Co.). The gauge sizes were 23G for the core material and 18G for the shell material. The coaxial needle functioned as an anode, and a sheet of aluminum foil served as a grounded cathode. A programmable syringe pump (pump rate equal to 3000 $\mu L\ hr^{-1}$) was used to maintain a slow, steady flow of the polymeric solutions into the electric field. This setup resulted in the polymers forming a Taylor cone jet that continuously moved toward the cathode. Fibers were formed when a critical voltage of 9 kV overcame the polymer surface tension—stretching the material, enhancing solvent evaporation, and forming the coaxial nanofibers. The fibers were collected (i.e., attracted and deposited) onto the aluminum foil.

For topological characterization of the nanofibers, transmission electron microscope (TEM) grids with 50×50 μm apertures were passed near the cathode in a weaving motion to collect in-air nanofibers. These fiber samples were first rinsed gently with deionized water to remove any residue of MSA from the surface and then dried for 15 min at 70° C. prior to characterization. Images were taken with a TEM (Phillips FEI Morgagni M 268).

Definitions

Unless otherwise defined, all technical and scientific terms used herein have the same meaning as commonly understood by one of ordinary skill in the art. In case of conflict, the present document, including definitions, will control. Preferred methods and materials are described below, although methods and materials similar or equivalent to those described herein can be used in practice or testing of the present invention. All publications, patent applications, patents and other references mentioned herein are incorporated by reference in their entirety. The materials, methods, and examples disclosed herein are illustrative only and not intended to be limiting.

The terms "comprise(s)", "include(s)", "having", "has", "can", "contain(s)", and variants thereof, as used herein, are intended to be open-ended transitional phrases, terms, or words that do not preclude the possibility of additional acts or structures. The singular forms "a", "and", and "the" include plural references unless the context clearly dictates otherwise. The present disclosure also contemplates other embodiments "comprising", "consisting of", and "consisting essentially of", the embodiments or elements presented herein, whether explicitly set forth or not.

The modifier "about" used in connection with a quantity is inclusive of the stated value and has the meaning dictated by the context (for example, it includes at least the degree of error associated with the measurement of the particular quantity). The modifier "about" should also be considered as disclosing the range defined by the absolute values of the two endpoints. For example, the expression "from about 2 to about 4" also discloses the range "from 2 to 4". The term "about" may refer to plus or minus 10% of the indicated number. For example, "about 10%" may indicate a range of 9% to 11%, and "about 1%" may mean from 0.9-1.1. Other meanings of "about" may be apparent from the context, such as rounding off, so, for example "about 1" may also mean from 0.5 to 1.4.

The conjunctive term "or" includes any and all combinations of one or more listed elements associated by the conjunctive term. For example, the phrase "an apparatus comprising A or B" may refer to an apparatus including A where B is not present, an apparatus including B where A is not present, or an apparatus where both A and B are present. The phrase "at least one of A, B, . . . and N" or "at least one of A, B, . . . N, or combinations thereof" are defined in the broadest sense to mean one or more elements selected from the group comprising A, B, . . . and N, that is to say, any combination of one or more elements A, B, . . . or N including any one element alone or in combination with one or more of the other elements, which may also include, in combination, additional elements not listed.

For the recitation of numeric ranges herein, each intervening number there between with the same degree of precision is explicitly contemplated. For example, for the range of 6-9, the numbers 7 and 8 are contemplated in addition to 6 and 9, and for the range 6.0-7.0, the number 6.0, 6.1, 6.2, 6.3, 6.4, 6.5, 6.6, 6.7, 6.8, 6.9, and 7.0 are explicitly contemplated.

For purposes of this disclosure, the chemical elements are identified in accordance with the Periodic Table of the Elements (CAS version) and the Handbook of Chemistry and Physics (98th Ed., inside cover).

It should be understood that the term "core" can describe a single fiber, a combination of fibers, a recompilation of fibers, or a structure derived from fibers. It should also be understood that the term "shell" can comprise a single tube, a combination of fibers, a reconstruction of fibers, or a structure derived from fibers.

Various features and advantages of the invention are set forth in the following claims.

What is claimed is:

1. A coaxial nanocomposite diode or transistor comprising:
    a polymer core comprising a first organic polymer; and
    a polymer shell comprising a second organic polymer, the polymer core and the polymer shell forming an individual nanofiber comprising a uniform shell thickness around the polymer core, the first organic polymer and the second organic polymer forming an electroactive coaxial p-n heterojunction diode or transistor.

2. The coaxial nanocomposite of claim 1, wherein the coaxial nanocomposite comprises a fiber or a disk.

3. The coaxial nanocomposite of claim 1, wherein the polymer core consists of the first organic polymer, wherein the first organic polymer is one of a p-type polymer or an n-type polymer.

4. The coaxial nanocomposite of claim 1, wherein the first organic polymer comprises more than one distinct organic polymer.

5. The coaxial nanocomposite of claim 1, wherein the first organic polymer comprises a blend of more than one organic polymer.

6. The coaxial nanocomposite of claim 1, wherein the first organic polymer comprises a blend of p-type regioregular poly(3-hexylthiophene-2,5-diyl) (P3HT) and polystyrene (PS).

7. The coaxial nanocomposite of claim 6, wherein the PS is present in an amount of about 6 wt % to about 8 wt % of the total weight of P3HT and PS.

8. The coaxial nanocomposite of claim 1, wherein the second organic polymer comprises n-type poly(benzimidazobenzophenanthroline) (BBL).

9. The coaxial nanocomposite of claim 1, wherein the coaxial nanocomposite has a diameter between about 200 nm and about 3000 nm.

10. The coaxial nanocomposite of claim 1, wherein the polymer core has a diameter of about 150 nm to about 250 nm and the polymer shell has a diameter of about 25 nm to about 75 nm.

11. A method of forming a coaxial nanocomposite diode or transistor, the method comprising:
    dissolving a first organic polymer in a first solvent to form a first mixture;
    dissolving a second organic polymer in a second solvent to form a second mixture; and
    electrospinning the first mixture and the second mixture concurrently to form an electroactive coaxial p-n heterojunction diode or transistor comprising a core of the first organic polymer and a shell of the second organic polymer, the core and the shell forming an individual nanofiber comprising a uniform shell thickness around the core.

12. The method of claim 11, wherein the first organic polymer is a blend of P3HT and about 5 wt % to about 10 wt % PS and the first solvent is chloroform ($CHCl_3$).

13. The method of claim 12, wherein the first mixture comprises greater than or equal to 0.1 wt % and less than or equal to 2.0 wt % P3HT of the total weight of the first mixture.

14. The method of claim 11, wherein the second organic polymer is BBL and the second solvent is methanesulfonic acid (MSA).

15. The method of claim 14, wherein the second mixture comprises about 0.20 wt % to about 0.50 wt % BBL of the total weight of the second mixture.

16. The method of claim 11, wherein the electrospinning includes two luer-lock syringes and a coaxial needle.

17. The method of claim 11, wherein the electrospinning is performed at a pump rate of about 3000 μL/hour and/or wherein the electrospinning is performed at a voltage of about 9 kV to about 15 kV.

18. The method of claim 11, wherein multiple coaxial nanocomposites are formed having the same or different diameters.

19. An article comprising a coaxial nanocomposite diode or transistor, the coaxial nanocomposite comprising:
    an individual nanofiber comprising a uniform thickness of a first organic polymer around a core of a second organic polymer, the first organic polymer and the second organic polymer forming an electroactive coaxial p-n heterojunction diode or transistor.

20. The article of claim 19, wherein the article is a sensor, a flexible sensor, a set of synchronized parallel sensors, a multi-gas nanosensor, a biosensor, a bioarray, a radiation detector, a rectifier, a channel, an electrode, a solar cell, a textile, an intelligent textile, a flexible device, or a flexible display.

* * * * *